US008188647B2

(12) United States Patent
Kimura et al.

(10) Patent No.: US 8,188,647 B2
(45) Date of Patent: May 29, 2012

(54) CURRENT-DRIVEN LIGHT-EMITTING DISPLAY APPARATUS AND METHOD OF PRODUCING THE SAME

(75) Inventors: Mutsumi Kimura, Suwa (JP); Tomoyuki Itoh, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 31 days.

(21) Appl. No.: 12/379,680

(22) Filed: Feb. 26, 2009

(65) Prior Publication Data

US 2009/0167148 A1    Jul. 2, 2009

Related U.S. Application Data

(60) Continuation of application No. 12/289,243, filed on Oct. 23, 2008, which is a continuation of application No. 10/465,878, filed on Jun. 20, 2003, now abandoned, which is a division of application No. 10/224,412, filed on Aug. 21, 2002, now Pat. No. 7,180,483, which is a division of application No. 09/155,644, filed as application No. PCT/JP98/00655 on Feb. 17, 1998, now Pat. No. 6,462,722.

(30) Foreign Application Priority Data

Feb. 17, 1997 (JP) .................................. 09-032474
Mar. 19, 1997 (JP) .................................. 09-066046

(51) Int. Cl.
    *H01J 1/28* (2006.01)
(52) U.S. Cl. .................. 313/498; 313/500; 313/506
(58) Field of Classification Search .......... 313/498–512; 427/66, 532–535, 539; 257/40, 72, 98–100, 257/642–643, 759
See application file for complete search history.

(56) References Cited

U.S. PATENT DOCUMENTS

| | | | |
|---|---|---|---|
| 4,042,854 A | 8/1977 | Luo et al. | |
| 4,087,792 A | 5/1978 | Asars | |
| 4,904,989 A | 2/1990 | Matsui et al. | |
| 5,151,805 A | 9/1992 | Takeda et al. | |
| 5,250,931 A | 10/1993 | Misawa et al. | |

(Continued)

FOREIGN PATENT DOCUMENTS

EP    0 112 700 A2    7/1984

(Continued)

OTHER PUBLICATIONS

European Office Action for European Application No 03 077 303.0 dated Nov. 23, 2009.

(Continued)

*Primary Examiner* — Joseph L Williams
*Assistant Examiner* — Fatima Farokhrooz
(74) *Attorney, Agent, or Firm* — Oliff & Berridge, PLC

(57) ABSTRACT

An electroluminescent device including a substrate, a transistor disposed above the substrate, the transistor including a gate electrode, a silicon film opposing the gate electrode, and a gate insulating film between the gate electrode and the silicon film. The electroluminescent device including a first interlayer insulation film covering the transistor, a second interlayer insulation film disposed above the first interlayer insulation film, and a pixel electrode disposed above the second interlayer insulation film and electrically connected to the transistor. The electroluminescent device including an organic EL layer disposed between the pixel electrode and a counter electrode, and a capacitor including a first electrode formed by the same material as the silicon film and a second electrode formed by the same material as the gate electrode.

5 Claims, 10 Drawing Sheets

U.S. PATENT DOCUMENTS

| | | | |
|---|---|---|---|
| 5,276,380 A * | 1/1994 | Tang | 313/504 |
| 5,302,966 A | 4/1994 | Stewart | |
| 5,386,179 A | 1/1995 | Sato | |
| 5,403,758 A | 4/1995 | Yoshihara | |
| 5,463,279 A | 10/1995 | Khormaei | |
| 5,525,867 A | 6/1996 | Williams | |
| 5,550,066 A | 8/1996 | Tang et al. | |
| 5,587,329 A | 12/1996 | Hseuh et al. | |
| 5,640,067 A | 6/1997 | Yamauchi et al. | |
| 5,657,039 A | 8/1997 | Mizukata et al. | |
| 5,670,792 A | 9/1997 | Utsugi et al. | |
| 5,684,365 A * | 11/1997 | Tang et al. | 315/169.3 |
| 5,686,932 A | 11/1997 | Tomita | |
| 5,691,783 A | 11/1997 | Numao et al. | |
| 5,693,962 A | 12/1997 | Shi et al. | |
| 5,701,055 A | 12/1997 | Nagayama et al. | |
| 5,714,838 A | 2/1998 | Haight et al. | |
| 5,714,968 A | 2/1998 | Ikeda | |
| 5,742,129 A | 4/1998 | Nagayama et al. | |
| 5,747,930 A | 5/1998 | Utsugi | |
| 5,748,160 A | 5/1998 | Shieh et al. | |
| 5,773,325 A | 6/1998 | Teramoto | |
| 5,786,796 A | 7/1998 | Takayama et al. | |
| 5,807,627 A | 9/1998 | Friend et al. | |
| 5,818,068 A | 10/1998 | Sasaki et al. | |
| 5,828,429 A | 10/1998 | Takemura | |
| 5,831,707 A | 11/1998 | Ota et al. | |
| 5,869,929 A | 2/1999 | Eida et al. | |
| 5,895,692 A | 4/1999 | Shirasaki et al. | |
| 5,897,328 A | 4/1999 | Yamauchi et al. | |
| 5,929,847 A | 7/1999 | Yanagi et al. | |
| 5,940,053 A | 8/1999 | Ikeda | |
| 5,949,188 A * | 9/1999 | Leising et al. | 313/505 |
| 5,977,562 A | 11/1999 | Hirakata et al. | |
| 5,986,632 A | 11/1999 | Takayama et al. | |
| 5,990,542 A | 11/1999 | Yamazaki | |
| 5,990,629 A | 11/1999 | Yamada et al. | |
| 5,995,073 A | 11/1999 | Isami et al. | |
| 6,011,529 A | 1/2000 | Ikeda | |
| 6,023,307 A | 2/2000 | Park | |
| 6,023,308 A | 2/2000 | Takemura | |
| 6,072,450 A | 6/2000 | Yamada et al. | |
| 6,081,250 A | 6/2000 | Shimada et al. | |
| 6,093,934 A | 7/2000 | Yamazaki et al. | |
| 6,108,065 A | 8/2000 | Ota et al. | |
| 6,166,396 A * | 12/2000 | Yamazaki | 257/59 |
| 6,204,610 B1 | 3/2001 | Komia | |
| 6,243,069 B1 | 6/2001 | Ogawa et al. | |
| 6,246,179 B1 | 6/2001 | Yamada | |
| 6,268,895 B1 | 7/2001 | Shimada et al. | |
| 6,294,799 B1 | 9/2001 | Yamazaki et al. | |
| 6,323,932 B1 | 11/2001 | Zhang et al. | |
| 6,424,326 B2 | 7/2002 | Yamazaki et al. | |
| 6,462,722 B1 | 10/2002 | Kimura et al. | |
| 6,518,962 B2 | 2/2003 | Kimura et al. | |
| 6,528,950 B2 | 3/2003 | Kimura | |
| 6,597,121 B2 | 7/2003 | Imura | |
| 6,744,069 B1 | 6/2004 | Yamazaki et al. | |
| 6,853,083 B1 | 2/2005 | Yamauchi et al. | |
| 6,972,746 B1 | 12/2005 | Takayama et al. | |
| 6,992,435 B2 | 1/2006 | Yamauchi et al. | |
| 7,298,357 B2 | 11/2007 | Takayama et al. | |
| 7,460,094 B2 | 12/2008 | Ozawa | |
| 7,476,900 B2 | 1/2009 | Yamauchi et al. | |
| 2004/0113872 A1 | 6/2004 | Nanno et al. | |
| 2004/0224456 A1 | 11/2004 | Abe | |
| 2005/0112341 A1 | 5/2005 | Ito et al. | |
| 2007/0102702 A1* | 5/2007 | Suzawa | 257/59 |

FOREIGN PATENT DOCUMENTS

| | | |
|---|---|---|
| EP | 0 349 265 A2 | 1/1990 |
| EP | 0 373 565 | 6/1990 |
| EP | 0 717 439 A2 | 6/1996 |
| EP | 0 717 445 A3 | 6/1996 |
| EP | 0 732 868 A1 | 9/1996 |
| EP | 0 849 721 A2 | 6/1998 |
| EP | 0 880 303 A1 | 11/1998 |
| EP | 0 653 741 B1 | 1/1999 |
| EP | 0 961 525 A1 | 12/1999 |
| FR | 2 488 016 A1 | 2/1982 |
| JP | A-58-140781 | 8/1983 |
| JP | A 61-059474 | 3/1986 |
| JP | A 61-255384 | 11/1986 |
| JP | 62-041193 | 3/1987 |
| JP | A-62-229952 | 10/1987 |
| JP | A-63-155527 | 6/1988 |
| JP | A 63-170682 | 7/1988 |
| JP | A-64-32236 | 2/1989 |
| JP | A 02-157815 | 6/1990 |
| JP | A-3-168617 | 7/1991 |
| JP | A-03-250583 | 11/1991 |
| JP | A-03-269995 | 12/1991 |
| JP | A 04-106530 | 4/1992 |
| JP | A-04-125683 | 4/1992 |
| JP | A 04-161984 | 6/1992 |
| JP | A-04-264527 | 9/1992 |
| JP | 04311066 * | 11/1992 |
| JP | 05-107557 | 4/1993 |
| JP | A 05-249916 | 9/1993 |
| JP | A 05-313195 | 11/1993 |
| JP | A 06-027484 | 2/1994 |
| JP | A-06-033048 | 2/1994 |
| JP | A-06-186416 | 7/1994 |
| JP | A 06-224391 | 8/1994 |
| JP | A 06-230745 | 8/1994 |
| JP | 07-007156 | 1/1995 |
| JP | A 07-111341 | 4/1995 |
| JP | 07-122362 | 5/1995 |
| JP | A-07-153574 | 6/1995 |
| JP | A-07-235378 | 9/1995 |
| JP | A 07-249778 | 9/1995 |
| JP | A-07-509339 | 10/1995 |
| JP | A 7-509339 | 10/1995 |
| JP | A 07-312290 | 11/1995 |
| JP | A-07-335895 | 12/1995 |
| JP | 08-054835 | 2/1996 |
| JP | 08-054836 | 2/1996 |
| JP | A 08-054836 | 2/1996 |
| JP | A 08-129358 | 5/1996 |
| JP | A 08-129359 | 5/1996 |
| JP | A-08-129360 | 5/1996 |
| JP | A 08-241048 | 7/1996 |
| JP | A 08-227276 | 9/1996 |
| JP | A-08-241048 | 9/1996 |
| JP | A 08-241057 | 9/1996 |
| JP | A-8-327978 | 12/1996 |
| JP | A-8-330600 | 12/1996 |
| JP | A 09-016123 | 1/1997 |
| JP | A-09-043640 | 2/1997 |
| JP | A 09-80412 | 3/1997 |
| JP | A-09-106887 | 4/1997 |
| JP | A-9-114414 | 5/1997 |
| JP | A 09-146119 | 6/1997 |
| JP | A 09-281476 | 10/1997 |
| JP | A 09-281525 | 10/1997 |
| JP | A-10-012377 | 1/1998 |
| JP | A 10-078761 | 3/1998 |
| JP | A 10-268254 | 10/1998 |
| TW | 193238 | 10/1992 |
| WO | WO 93/24921 | 12/1993 |
| WO | WO 94/0303 | 2/1994 |
| WO | WO 96/06456 | 2/1996 |

OTHER PUBLICATIONS

Seifart, "Analoge Schaltungen," VEB Verlag Technik Berlin, Berlin, 1989.

De Smet et al., "Active Matrix with Integrated Drivers on Soda-Lime Glass Using Poly-CdSe and Poly-Ge," Journal of the Society for Information Display, Dec. 1993, pp. 423-428.

De Rijke et al., "2-MHZ Clocked LCD Drivers on Glass," Journal of Solid-State Circuits, Apr. 1990, pp. 531-538.

Kogakusha McGraw-Hill, XP-002283126, "Integrated Electronics: Analog and Digital Circuits and Systems", 1972, pp. 310-329.

W. E. Howard, "Active-Matrix Techniques for Display", Proceedings of the SID, Society for Information Display, 1986, vol. 27, No. 4, pp. 313-326.

R. E. Proano et al., Development and Electrical Properties of Undoped Polycrystalline Silicon Thin-Film Transistors, IEEE Transactions on Electron Devices, vol. 36, No. 9-I, Sep. 1989, pp. 1915-1922.

Alan G. Lewis et al., "Polysilicon TFT Circuit Design and Performance", IEEE Journal of Solid-State Circuits, vol. 27, No. 12, Dec. 1992, pp. 1833-1842.

M. G. Clark, "Current Status and Future Prospects of Poly-Si Devices", IEE Proceedings: Circuits Devices and Systems, Institution of Electrical Engineers, vol. 141, No. 1, Feb. 1994, pp. 3-8.

T. P. Brody et al., "A 6X6-in 20-lpi Electroliminescent Display Panel", IEEE Transactions on Electron Devices, vol. ED-22, No. 9, Sep. 1975, pp. 739-748.

T. P. Brody et al., "A 6x6-in 20-lpi Electroluminescent Display Panel," IEEE Transactions on Electron Devices, vol. ED-22, No. 9, Sep. 1975, pp. 739-748.

May 5, 2010 Office Action issued in European Application No. 03 077 303.0.

Unagami T et al., "High-Voltage TFT Fabricated in Recrystallized Polycrystalline Silicon," IEEE Transactions on Electron Devices, vol. 35, No. 3, pp. 314-319, Mar. 1988.

Wu C et al., "Integration of Organix LED's and Amorphous Si TFT's onto Flexible and Lightweight Metal Foil Substrates," IEEE Electron Device Letters, vol. 18, No. 12, pp. 609-612, Dec. 1997.

Office Action in U.S. Appl. No. 11/505,459, dated Jun. 25, 2010.

May 5, 2011 Office Action issued in European Patent Application No. 03076313.0.

"Integration of organic LEDs and amorphous Si TFTs onto unbreakable metal foil substrates", pp. 957-959.

May 5, 2011 Office Action issued in European Patent Application No. 03077303.0.

May 23, 2011 Office Action issued in U.S. Appl. No. 11/505,457.

Jun. 17, 2011 Office Action issued in U.S. Appl. No. 12/155,813.

Phisical Mechanisms for Short Channel Effects in Polysilicon Thin Film Transistors IEEE, 1989, pp. 13.4.1-13.4.4.

Nov. 4, 2003 Notice of Allowance issued in U.S. Appl. No. 10/068,890.

Jul. 27, 2006 Notice of Allowance issued in U.S. Appl. No. 10/625,617.

Sep. 15, 2008 Notice of Allowance issued in U.S. Appl. No. 11/505,450.

Jan. 9, 2009 Notice of Allowance issued in U.S. Appl. No. 11/505,450.

Jun. 1, 2009 Notice of Allowance issued in U.S. Appl. No. 11/505,450.

Sep. 30, 2010 Notice of Allowance issued in U.S. Appl. No. 12/618,229.

Jul. 16, 2002 Office Action issued in U.S. Appl. No. 10/068,890.

Dec. 30, 2002 Office Action issued in U.S. Appl. No. 10/068,890.

Jul. 31, 2003 Office Action issued in U.S. Appl. No. 10/068,890.

Jun. 14, 2005 Office Action issued in U.S. Appl. No. 10/625,617.

Dec. 14, 2005 Office Action issued in U.S. Appl. No. 10/625,617.

Apr. 4, 2006 Office Action issued in U.S. Appl. No. 10/625,617.

Oct. 2, 2007 Office Action issued in U.S. Appl. No. 11/505,450.

Feb. 27, 2008 Final Office Action issued in U.S. Appl. No. 11/505,450.

Jun. 2, 2009 Office Action issued in U.S. Appl. No. 11/505,457.

Nov. 24, 2009 Office Action issued in U.S. Appl. No. 11/505,457.

Jun. 7, 2010 Office Action issued in U.S. Appl. No. 11/505,457.

Dec. 10, 2010 Office Action issued in U.S. Appl. No. 11/505,457.

Jun. 16, 2009 Office Action issued in U.S. Appl. No. 11/505,459.

Jan. 4, 2010 Office Action issued in U.S. Appl. No. 11/505,459.

Dec. 20, 2010 Office Action issued in U.S. Appl. No. 11/505,459.

Sep. 15, 2006 Supplemental Notice of Allowability issued in U.S. Appl. No. 10/625,617.

Aug. 25, 2003 Search Report issued in European Patent Application No. 03075377.6.

Nov. 21, 2003 Search Report issued in European Patent Application No. 03075377.6.

Sep. 6, 2011 Office Action issued in Japanese Patent Application No. 2008-200493, with translation.

Sep. 12, 2011 Examination result issued in European Patent Application No. 07 075 433.8.

Sep. 23, 2011 Notice of Allowance issued in U.S. Appl. No. 11/505,459.

Oct. 4, 2011 Office Action issued in Japanese Patent Application No. 2008-206695 (with English Translation).

Nov. 29, 2011, Japanese Office Action issued in Japanese Patent Application No. 2009-089815 (with translation).

* cited by examiner

CURRENT-DRIVEN LIGHT-EMITTING DISPLAY APPARATUS AND METHOD OF PRODUCING THE SAME

This is a Continuation of application Ser. No. 12/289,243, filed Oct. 23, 2008, which in turn is a Continuation of application Ser. No. 10/465,878, filed Jun. 20, 2003, which in turn is a Division of application Ser. No. 10/224,412, filed Aug. 21, 2002, which in turn is a Division of application Ser. No. 09/155,644, filed Oct. 2, 1998, which in turn us the U.S. National Phase of PCT/JP98/00655, filed Feb. 17, 1998, which in turn claims priority of Japanese Application No. 09-032474, filed Feb. 17, 1997, and Japanese Application No. 09-066046, filed Mar. 19, 1997. The disclosure of the prior applications is hereby incorporated by reference herein in its entirety.

BACKGROUND OF THE INVENTION

1. Field of Invention

The invention relates to a display apparatus in which a current-driven light-emitting device, such as an organic electro luminescence (hereinafter referred to as "EL") display device, are driven by using thin-film transistors. More particularly, the invention relates to a current-driven light-emitting display apparatus driven by thin-film-transistors, which realizes the suppression of deterioration with time, and to a method of producing the same.

2. Description of Related Art

The inventor of this invention carefully examined organic EL display devices driven by thin-film transistors, and ascertained the following facts.

(1) In an organic EL display device driven by thin-film transistors, since the organic EL display device is a direct-current device, direct current also runs through thin-film transistors, which are connected in series to the EL device, for the purpose of controlling it.

(2) Thin-film transistors are classified into an n-channel type and a p-channel type. These types differ extremely in the manner in which deterioration with time occurs.

Accordingly, an object of the present invention is to suppress the deterioration with time of thin-film transistors in a current luminescent device driven by the thin-film transistors.

SUMMARY OF THE INVENTION (1) In the present invention, there is provided a current-driven light-emitting display apparatus comprising a plurality of scanning lines and a plurality of data lines, thin-film transistors and current luminescent devices being formed in positions corresponding to each of the intersections of the scanning lines and the data lines, wherein at least one of the thin-film transistors is a p-channel type thin-film transistor.

It is possible to suppress the deterioration with time of a thin-film transistor with this apparatus.

(2) In the present invention, there is provided a current-driven light-emitting display apparatus in which a plurality of scanning lines a plurality of data lines, common electrodes, and opposite electrodes are formed, with first thin-film transistors being formed in positions corresponding to the intersections of the scanning lines and the data lines, second thin-film transistors, holding capacitors, pixel electrodes, and current luminescent elements, the first thin-film transistors controlling conductivity between the data lines and the holding capacitors by the potentials of the scanning lines, the second thin-film transistors controlling conductivity between the common electrodes and the pixel electrodes by the potentials of the holding capacitors, to thereby control the current which flows through the current luminescent elements provided between the pixel electrodes and the opposite electrodes wherein the second thin-film transistors are p-channel type thin-film transistors.

(3) In the present invention, there is provided a current-driven light-emitting display apparatus according to (1) or (2), further comprising a driving circuit for driving the current luminescent element, the driving circuit is comprised of the plurality of scanning lines, the plurality of data lines, the thin-film transistors, and the current luminescent elements, which are disposed on the substrate, wherein the p-channel type thin-film transistors are formed in the same step as the thin-film transistors in the driving circuits.

(4) In the current-driven light-emitting display apparatus according to any of (1) or (3), the thin-film transistors are polysilicon thin-film transistors.

(5) The invention provides a current-driven light-emitting display apparatus according to (3), wherein the drive circuits comprise complementary type thin-film transistors, the first thin-film transistors are formed in the same step as n-channel type thin-film transistors in the driving circuits, and the second thin-film transistors are formed in the same step as the p-channel type thin-film transistors in the driving circuits.

According to (5), it is possible to provide a current-driven light-emitting display apparatus, which exhibits high performance with no deterioration with time, without increasing the number of steps for producing the apparatus.

Figure 12:
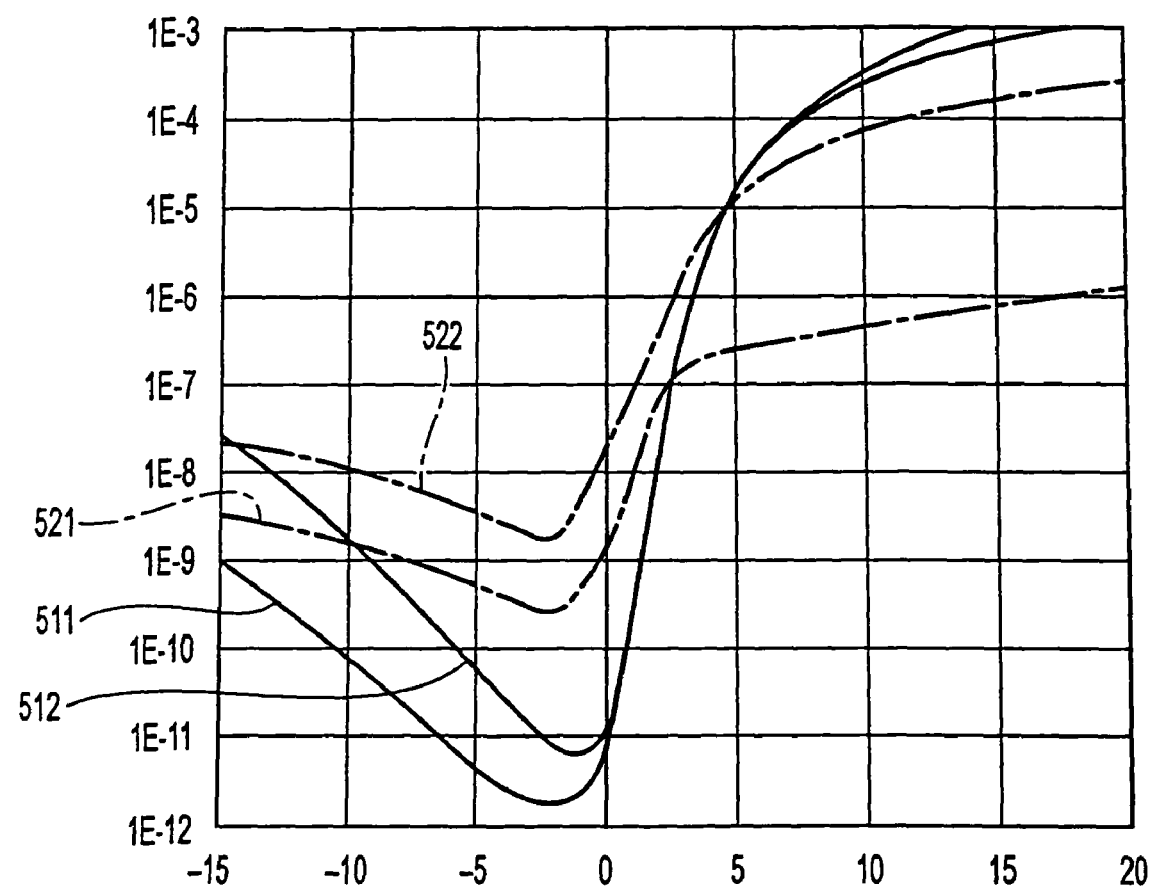
Figure 13:
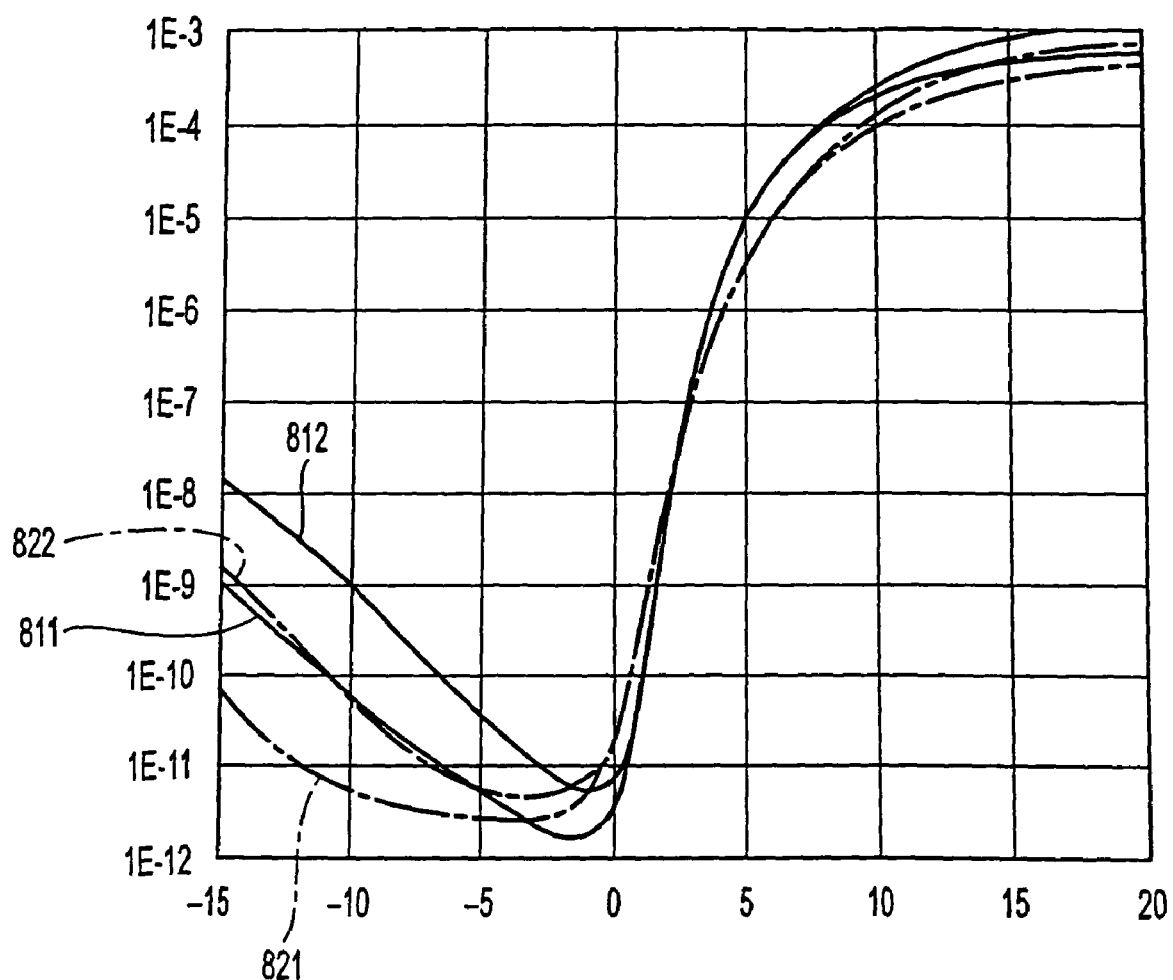

is a plan view of an organic EL display device equipped with thin-film transistors according to the second embodiment of the present invention;

FIG. 12 is a chart showing the deterioration with time of an n-channel type thin-film transistor;

FIG. 13 is a chart showing the deterioration with time of a p-channel type thin-film transistor; and FIG. 14(a)-(d) are flow diagrams of the process for producing a thin-film-transistor-drive organic EL display device according to the present invention.

DETAILED DESCRIPTION OF PREFERRED EMBODIMENTS

The General Structure of an Organic El Display Device

Referring to the drawings, the preferred embodiments of the present invention will be described.

Figure 1:
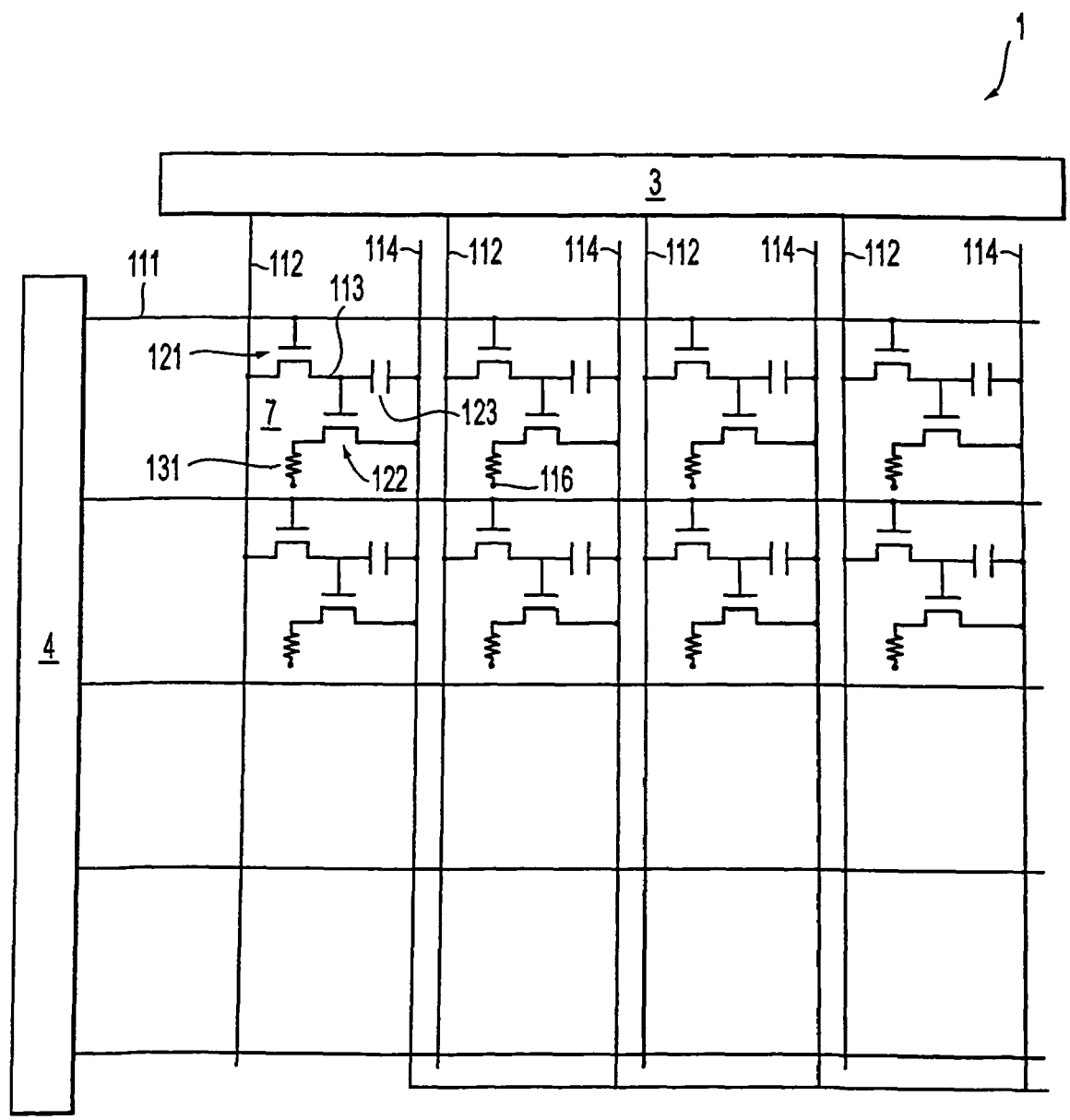
FIG. 1 is a block diagram of the basic structure of a display to which the present invention is applied.

As shown in FIG. 1, the center region of a substrate 1 constitutes a display part. In the outer periphery of the transparent substrate 1, at the top side of the drawing, a data-side drive circuit 3, which outputs image signals to data lines 112, is arranged, and at the left side of the drawing, a scanning-side drive circuit 4, which outputs scanning signals to scanning lines 111, is arranged. In these drive circuits 3 and 4, n-type thin-film transistors and p-type thin-film transistors form complementary type TFTs. These complementary type thin-film transistors are included in shift register circuits, level shift circuits, analog switch circuits, etc.

Arranged on the transparent substrate 1 are a plurality of scanning lines 111, and a plurality of data lines 112 extending in a direction perpendicular to the direction in which the scanning lines extend. The intersections of these data lines 112 and scanning lines 111 constitute pixels 7 in the form of a matrix.

Formed in each of these pixels 7 is a first thin-film transistor (hereinafter referred to as "a switching thin-film transistor") 121, in which scanning signals are supplied to a gate electrode 21 (a first gate electrode) through the scanning line 111. One end of the source/drain region of the switching thin-film transistor 121 is electrically connected to a data line 112, while the other end of the source/drain region is electrically connected to a potential holding electrode 113. In addition, a common line 114 is disposed in parallel to the scanning line 111. Holding capacitor 123 is formed between the common line 114 and the potential holding electrode 113. The common line is maintained at a controlled potential. Accordingly, when the switching thin-film transistor 121 is turned ON through the selection by a scanning signal, the image signal from the data line 112 is written to the holding capacitor 123 through the switching thin-film transistor.

The potential holding electrode 113 is electrically connected to the gate electrode of second thin-film transistor 122 (hereinafter referred to as "a current-thin-film transistor"). The one end of the source/drain region of the current-thin-film transistor 122 is electrically connected to a common line 114, while, the other end of the source/drain region is electrically connected to one electrode 115 of a luminescent element 131. When the current-thin-film transistor 122 is turned ON, the current of the common line 114 flows to the luminescent element 131 of such as an organic EL display device through the current-thin-film transistor 122, so that the luminescent element 131 emits light. Further, although one electrode of the holding capacitor is connected to a common line 114 in this arrangement, it is also possible for it to be connected to a capacitance line being provided separately, instead of being connected to the common line 114. Alternatively, one electrode of the holding capacitor may be connected to an adjacent gate line.

First Embodiment

Figure 2:
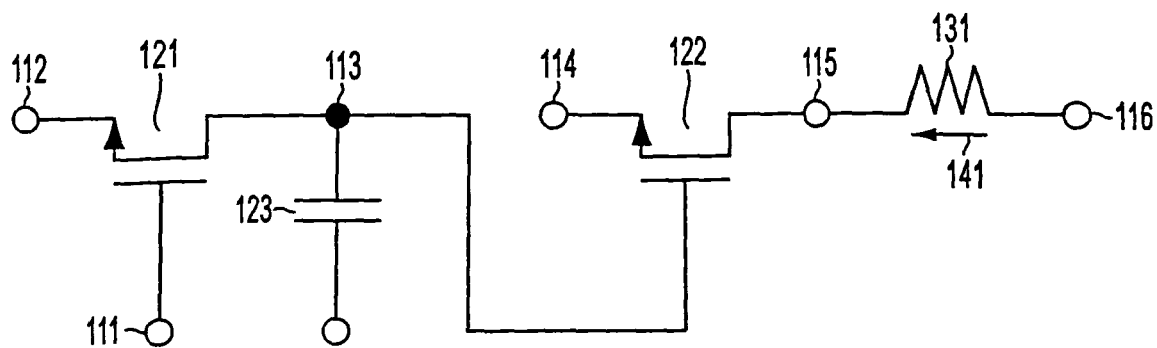
FIG. 2 is an equivalent circuit diagram of a display device equipped with thin-film transistors according to a first embodiment of the present invention.
Figure 3:
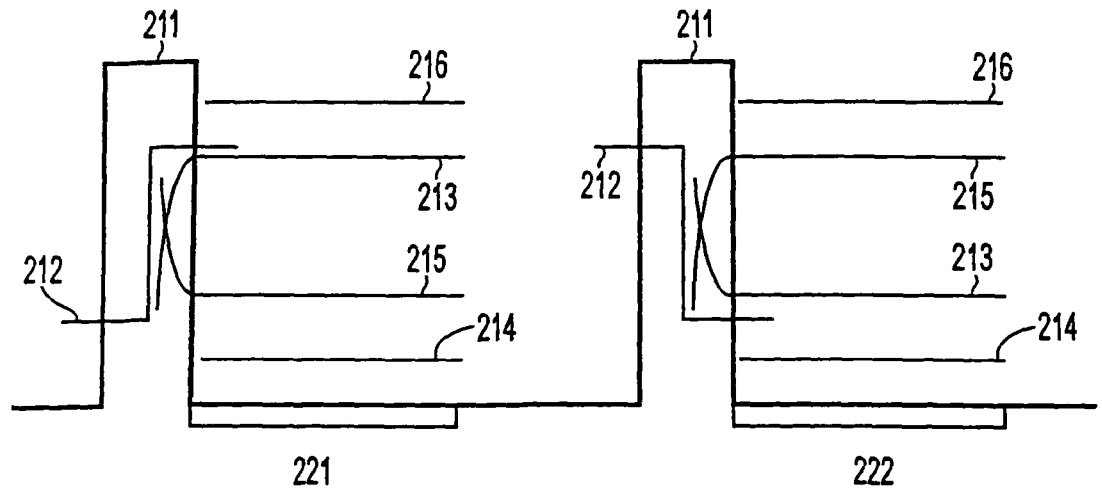
FIG. 3 is a drive voltage diagram of the display device equipped with thin-film transistors according to the first embodiment of the present invention.
Figure 4:
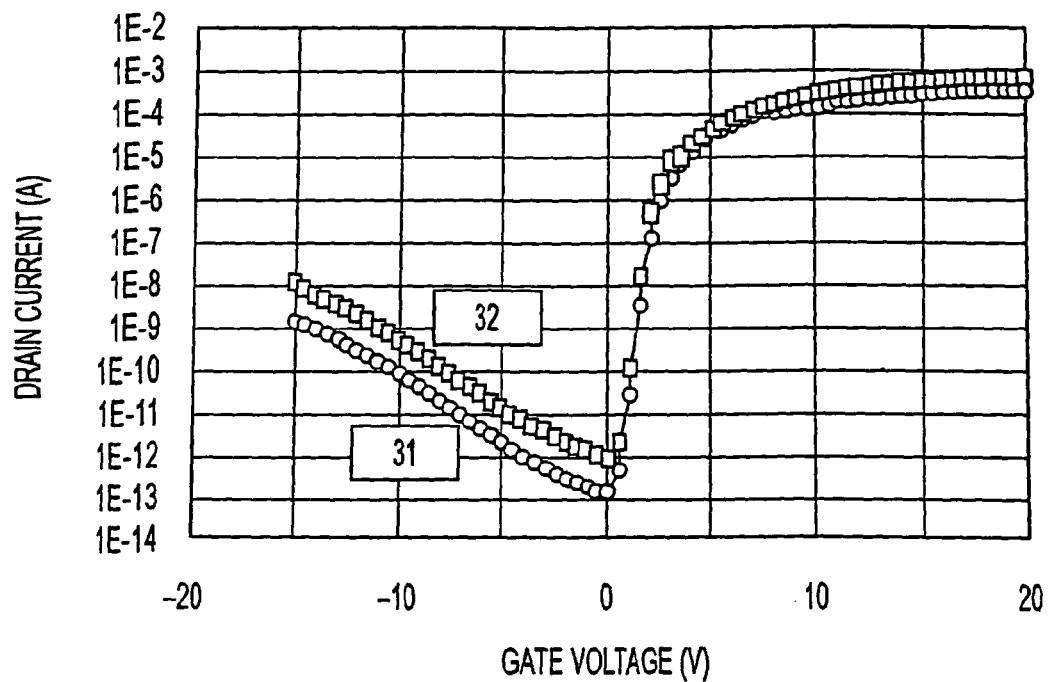
FIG. 4 is a current-voltage characteristic chart of a current-thin-film transistor according to the first embodiment of the present invention.
Figure 5:
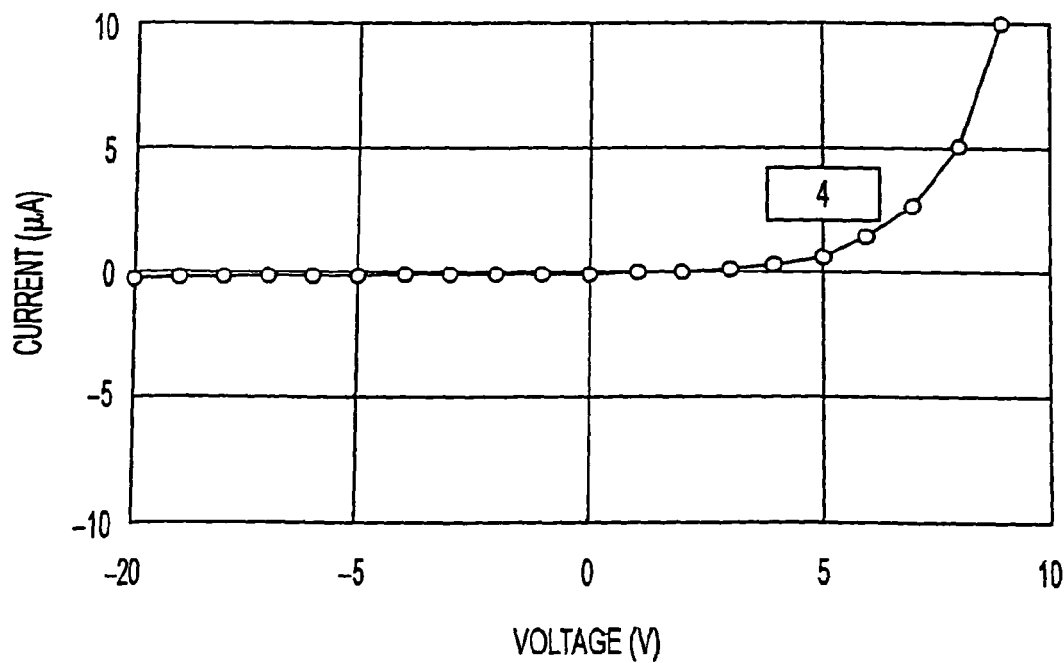
FIG. 5 is a current-voltage characteristic chart of an organic EL display device according to the first embodiment of the present invention.

FIG. 2 is a block diagram of an organic EL display device equipped with thin-film transistors, according to a first embodiment of the present invention. FIG. 3 is a drive voltage diagram of an organic EL display device with thin-film transistors according to the first embodiment of the present invention. FIG. 4 is a current-voltage characteristic diagram of a current-thin-film transistor according to the first embodiment of the present invention. FIG. 5 is a current-voltage characteristic chart of an organic EL display device, according to the first embodiment of the present invention.

In FIG. 2, there are shown a scanning line 111, a data line 112, a holding electrode 113, a common line 114, a pixel electrode formed of Al 115, an opposite electrode formed of ITO 116, a switching thin-film transistor 121, an n-channel type current-thin-film transistor 122, a holding capacitor 123, an organic EL display element 131 (hereinafter referred to as "a forward oriented organic EL display device") which is caused to emit light by the current flowing to the pixel electrode 115 from the opposite electrode 116, and the current directions of the organic EL display device 131 and 141.

In FIG. 3, there are shown a scanning potential 211, a signal potential 212, a holding potential 213, a common potential 214, a pixel potential 215, and a counter potential 216. FIG. 3, only a part of each potential is shown to illustrate the respective potential relationships. The potential of the scanning line 111 corresponds to the scanning potential 211; the potential of the data line 112 corresponds to the signal potential 212; the potential of the holding electrode 113 corresponds to the holding potential 213; the potential of the common line 114 corresponds to the common potential 214; the potential of the pixel electrode 115 formed of Al corresponds to the pixel potential 215; and the potential of the opposite electrode 116 formed of ITO (Indium Tin oxide) corresponds to the counter potential 216. FIG. 3 shows each signal potential schematically and partially.

Numeral 221 indicates a period in which a pixel is in the display-state, wherein current flows into the forward oriented organic EL display element 131, so that it emits light, and numeral 222 indicates a period in which the pixel is in the non-display state, wherein current does not flow into the forward oriented organic EL display element 131, so that it does not emit light.

Referring to FIG. 4, a curve 31 indicates the current-voltage characteristic of the n-channel type current-thin-film transistor 122 as observed when the drain voltage is 4V, and a curve 32 indicates the current-voltage characteristic of the n-channel type current-thin-film transistor 122 as observed when the drain voltage is 8V. Regarding either drain voltage, the following facts can been seen. When the gate voltage is low, the n-channel type current-thin-film transistor 122 is turned OFF and a small amount of drain current flows demonstrating a high source/drain resistance. When the gate voltage is high, the n-channel type current-thin-film transistor 122 is turned ON and a large amount of drain current flows demonstrating a low source/drain resistance.

In FIG. 5, numeral 4 indicates the current-voltage characteristic of the forward oriented organic EL display element 131. Here, the voltage represents the counter potential 216 against the pixel potential 215, and the current represents the current which flows to the pixel electrode 115 from the opposite electrode 116. The forward oriented organic EL display element 131 is OFF when the voltage is not higher than a certain threshold voltage; the resistance is high and allows no current to flow, so that the device does not emit light. The device is ON when the voltage is over a certain threshold voltage, and the resistance is low and allows current to flow, so that the device emits light. In this case, the threshold voltage is approximately 2V.

The operation of an organic EL display device equipped with the thin-film transistors of this embodiment will be described with reference to FIG. 2, FIG. 3, FIG. 4, and FIG. 5.

The switching thin-film transistor 121 controls the conductivity between the data line 112 and the holding electrode 113 by means of the potential of the scanning line 111. In other words, the scanning potential 211 controls the conductivity between the signal potential 212 and the holding potential 213. While in this example, the switching thin-film transistor 121 is an n-channel type thin-film transistor, a p-channel type thin-film transistor is also applicable.

For the period 221 in which the pixel is in the display-state, the signal potential 212 is high, and the holding potential 213 is retained at a high level. For the period 222 in which the pixel is in the non-display state, the signal potential 212 is low, and the holding potential 213 is retained at a low level.

The n-channel type current-thin-film transistor 122 has the characteristic as shown in FIG. 3 and controls the conductivity between the common line 114 and the pixel electrode 115 by means of the potential of the holding electrode 113. In other words, the holding potential 213 controls the conductivity between the common potential 214 and the pixel potential 222. For the period 221 in which the pixel is in the display-state, the holding potential 213 is high, so that the common line 114 is electrically connected to the pixel electrode 115. For the period 222 in which the pixel is in the non-display state, the holding potential 213 is low, so that the common line 114 is disconnected from the pixel electrode 115.

The organic EL display element 131 has the characteristic as shown in FIG. 5. For the period 221 in which the pixel is in the display-state, the current flows between the pixel electrode 115 and the opposite electrode 116, so that the organic EL display element 131 emits light. For the period 222 in which the pixel is in the non-display state, no current flows, so that the device does not emit light.

Figure 6A:
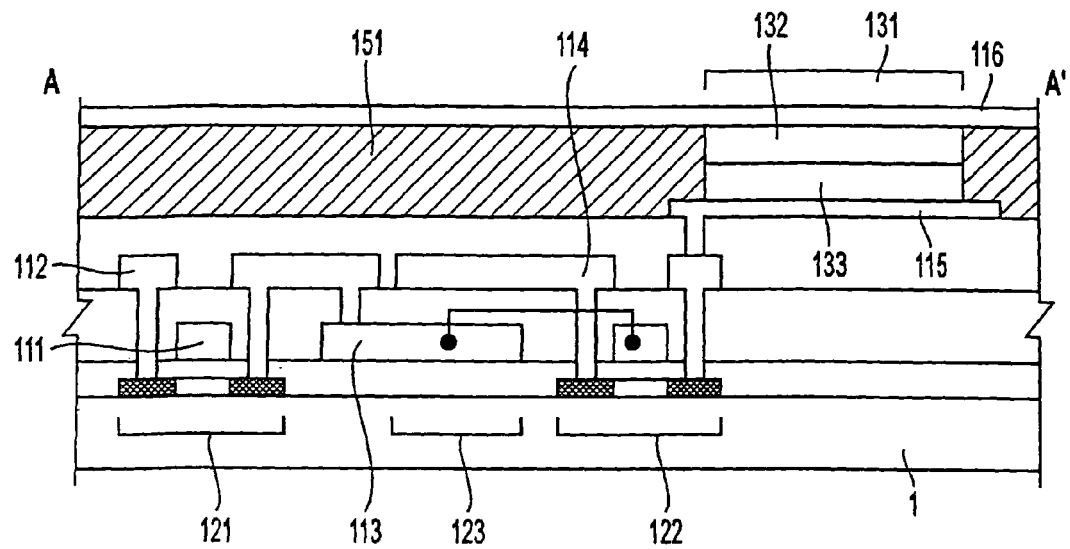
FIG. 6(a) is a sectional view of an organic display EL device equipped with thin-film transistors according to the first embodiment of the invention.
Figure 6B:
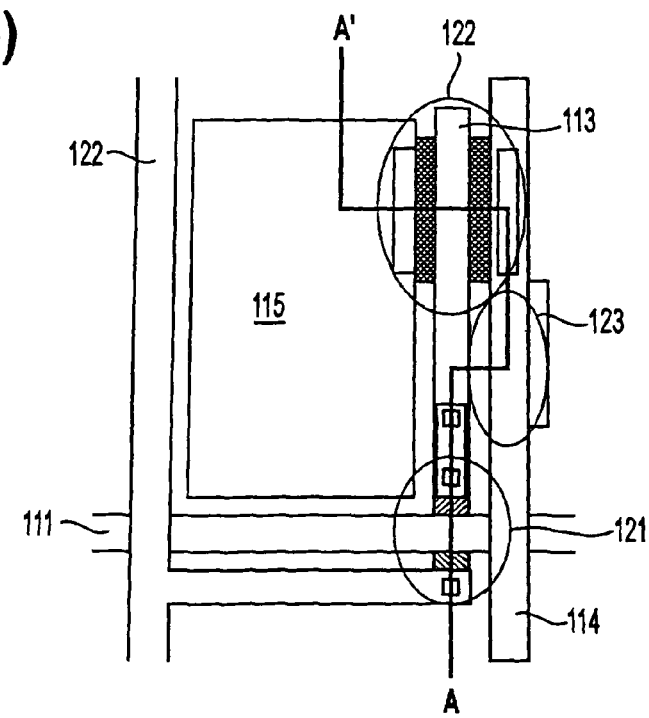
FIG. 6(b) is a plan view of an organic display EL device according to the first embodiment of the present invention.

FIG. 6(a) is a sectional view of a thin-film transistor organic EL display device (1 pixel) according to an embodiment of the present invention. FIG. 6(b) is a plan view of a thin-film transistor organic EL display device (1 pixel) according to an embodiment of the present invention. The section taken along the line A-A' of FIG. 6(a) corresponds to the section taken along the line A-A' of FIG. 6(b).

In FIG. 6(a), numeral 132 indicates a hole injection layer, numeral 133 indicates an organic EL layer, and numeral 151 indicates a resist.

In this example, the switching thin-film transistor 121 and the n-channel type current-thin-film transistor 122 adopt the structure and the process ordinarily used for a low-temperature polysilicon thin-film transistor, which are used for thin-film transistor liquid crystal display devices, i.e., a top-gate structure and a process conducted in the condition that the maximum temperature is 600° C. or less. However, other structures and processes are also applicable.

The forward oriented organic EL display element 131 is formed by the pixel electrode 115 formed of Al, the opposite electrode 116 formed of ITO, the hole injection layer 132, and the organic EL layer 133. In the forward oriented organic EL display element 131, the direction of current of the organic EL display device, indicated at 141, can be set from the opposite electrode 116 formed of ITO to the pixel electrode 115 formed of Al. Further, the structure of the organic EL display device is not restricted to the one used here. Other structures are also applicable, as long as the direction of current of the organic EL display device, indicated at 141, can be set to the direction from the opposite electrode to pixel electrode.

Here, the hole injection layer 132 and the organic EL layer 133 are formed by an ink-jet printing method, employing the resist 151 as a separating structure between the pixels, and the opposite electrode 116 formed of ITO is formed by a sputtering method, yet other methods are also applicable.

In this embodiment, the common potential 214 is lower than the counter potential 216, and the current-thin-film transistor is the n-channel type current-thin-film transistor 122.

In the period 221 in which the pixel is in the display-state, the n-channel type current-thin-film transistor 122 is ON. The current which flows through the forward oriented organic EL display element 131, i.e., the ON-current of the n-channel type current-thin-film transistor 122 depends on the gate voltage, as shown in FIG. 4. Here, the term "gate voltage" means the potential difference between the holding potential 213 and the lower one of the common potential 214 and the pixel potential 215. In this embodiment, the common potential 214 is lower than the pixel potential 215, so that the gate voltage indicates the potential difference between the holding potential 213 and the common potential 214. The potential difference can be sufficiently large, so that a sufficiently large amount of ON-current is obtainable. The ON-current of the n-channel type current-thin-film transistor 122 also depends on the drain voltage. However, this does not affect the above situation.

Conversely, in order to obtain a necessary amount of ON-current, the holding potential 213 can be made lower, and the amplitude of the signal potential 212 and therefore the amplitude of the scanning potential 211 can be decreased. In other words, in the switching thin-film transistor 121 and the n-channel type current-thin-film transistor 122, a decrease in drive voltage can be achieved without entailing any loss in image quality, abnormal operations, or a decrease in the frequency enabling them to operate.

Further, in the embodiment of the present invention, the signal potential 212 for the pixel to be in the display-state is lower than the counter potential 216.

As stated above, in the period 221 in which the pixel is in the display-state, the ON-current of the n-channel type current-thin-film transistor 122 depends on the potential difference between the holding potential 213 and the common potential 214, but not directly on the potential difference between the holding potential 213 and the counter potential 216. Thus, the holding potential 213, i.e., the signal potential 212 for the pixel to be in the display-state, can be made lower than the counter potential 216, and therefore, the amplitude of the signal potential 212 and the amplitude of the scanning potential 211 can be decreased, while retaining a sufficiently large ON-current in the n-channel type current-thin-film transistor 122. That is, in the switching thin-film transistor 121 and the n-channel type current-thin-film transistor 122, a decrease in drive voltage can be accomplished without entailing any loss in image quality, abnormal operations, and a decrease in the frequency enabling them to operate.

Moreover, in this embodiment, the signal potential 212 for the pixel to be in the non-display-state is higher than the common potential 214.

In the period 222 in which the pixel is in the non-display-state, when the signal potential 212 becomes slightly higher than the common potential 214, the n-channel type current-thin-film transistor 122 is not completely turned OFF. However, the source/drain resistance of the n-channel type current-thin-film transistor 122 becomes considerably higher, as shown in FIG. 4. Thus, the pixel potential 215, which is determined by dividing the common potential 214 and the counter potential 216 by the values of the resistance of the n-channel type current-thin-film transistor 122 and the resistance of the forward oriented organic EL display element 131, becomes a potential close to the counter potential 216.

The voltage which is applied to the forward oriented organic EL display element 131 is the potential difference between the pixel potential 215 and the counter potential 216. As shown in FIG. 5, the forward oriented organic EL display element 131 is turned OFF when the voltage is not higher than a certain threshold voltage, when no current flows, so that the display device does not emit light. Namely, the utilization of a threshold potential of the forward oriented organic EL display element 131 makes it possible for the forward oriented organic EL display element 131 not to emit light, even if the signal potential 212 is slightly higher than the common potential 214, and the n-channel type current-thin-film transistor 122 is not completely turned OFF.

Here, the amplitude of the signal potential 212, and therefore the amplitude of the scanning potential 211 can be decreased by making the signal potential 212 for the pixel to be in the non-display state to be higher than the common potential 214. In other words, with regard to the switching thin-film transistor 121 and the n-channel type current-thin-film transistor 122, a decrease in drive potential can be accomplished without entailing any loss of image quality, abnormal operations, or a decrease in the frequency enabling them to operate.

The operation of an organic EL display device equipped with the thin-film transistors of this embodiment is not as simple as described above; it operates under a more complicated relationship between voltage and current. However, the description above holds true approximately and qualitatively.

Second Embodiment

Figure 7:
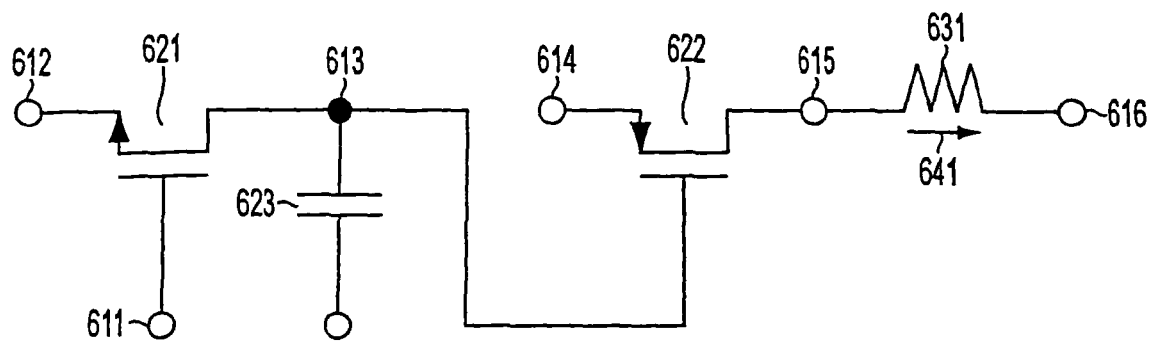
FIG. 7 is an equivalent circuit diagram of an organic EL display device equipped with thin-film transistors used in a second embodiment of the present invention.
Figure 8:
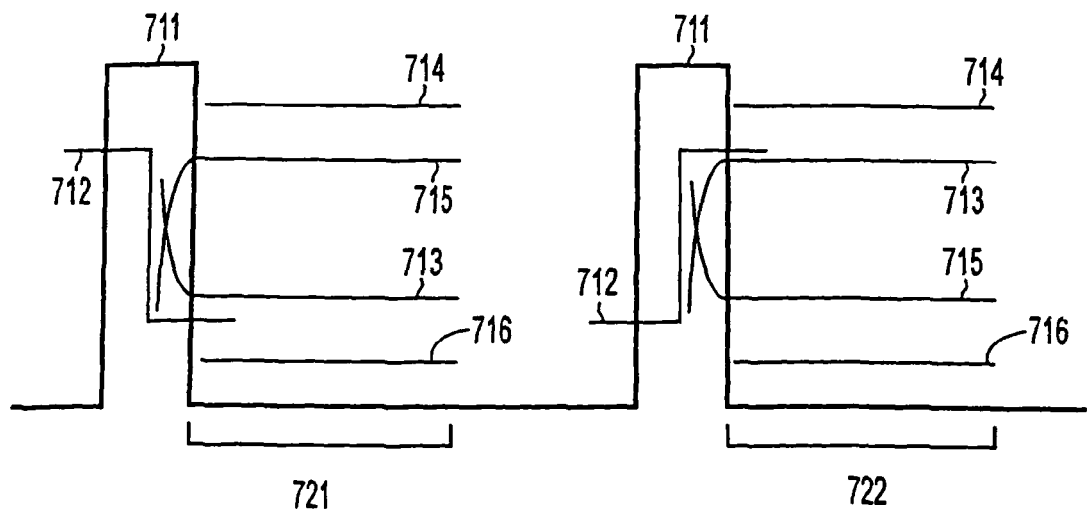
FIG. 8 is a drive-voltage diagram of an organic EL display device equipped with thin-film transistors according to the second embodiment of the present invention.
Figure 9:
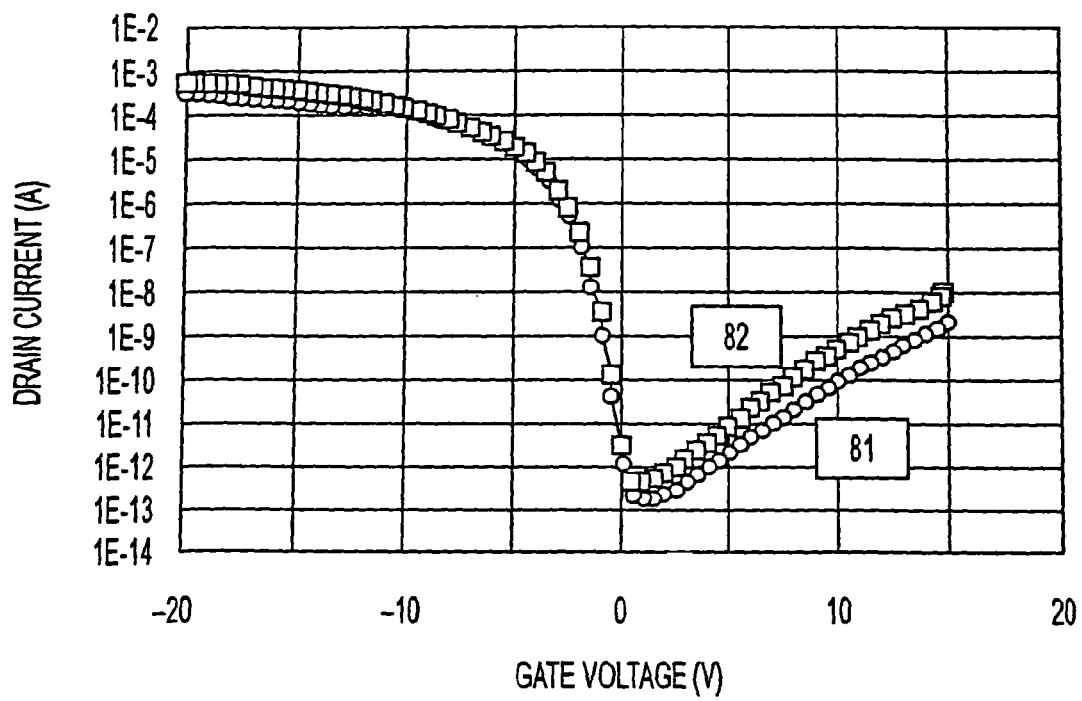
FIG. 9 is a current-voltage characteristic chart of a current-thin-film transistor according to the second embodiment of the present invention.

FIG. 7 is an equivalent circuit diagram of an organic EL display device equipped with thin-film transistors, according to the second embodiment of the present invention. FIG. 8 is a drive voltage diagram of the organic EL display device with thin-film transistors, according to the second embodiment of the present invention. FIG. 9 is a current-voltage characteristic chart of the organic EL display device according to the second embodiment of the present invention.

In FIG. 7, there are shown a pixel electrode formed of ITO 615, an opposite electrode formed of Al 616, a p-channel type current-thin-film transistor 622, and an organic EL display device 631 (hereinafter referred to as "a reverse oriented organic EL display device"), which is caused to emit light by the current flowing to the Opposite electrode 616 from the pixel electrode 615. Numeral 641 indicates the direction of the current of the organic EL display device. This direction is the reverse of that shown in FIG. 2. Except for this, this embodiment is the same as the above first embodiment shown in FIG. 2.

FIG. 8 is the same as FIG. 3 except that the level of each potential is different from that of FIG. 3.

In FIG. 9, a curve 81 indicates a current-voltage characteristic of a p-channel type current-thin-film transistor 622 as observed when the drain voltage is 4V. A curve 82 indicates a current-voltage characteristic of the p-channel type current-thin-film transistor 622 as observed when the drain voltage is 8V.

Figure 10:
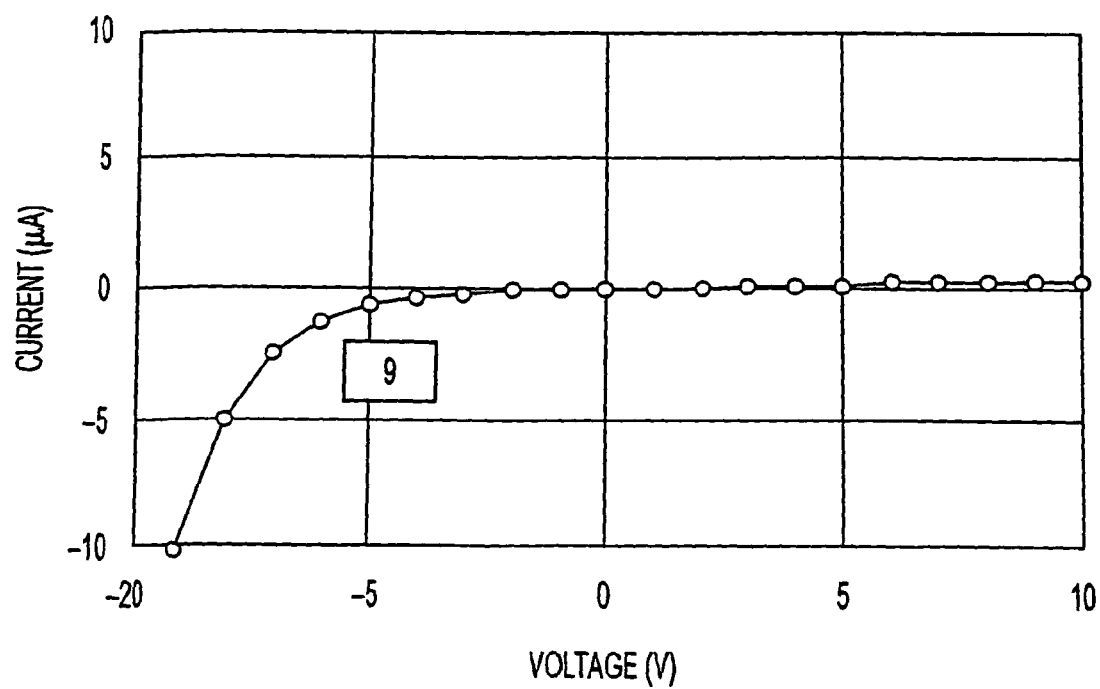
FIG. 10 is a current-voltage characteristic chart of an organic EL display device according to the second embodiment of the present invention.

In FIG. 10, a curve 9 indicates a current-voltage characteristic of a reverse oriented organic EL display device 631.

The organic EL display device equipped with the thin-film transistors of this embodiment operates in the same way as that of the first embodiment, except that the potential relationship regarding the current-thin-film transistor is reversed due to the fact that the current-thin-film transistor is the p-channel type thin-film transistor 622.

Figure 11A:
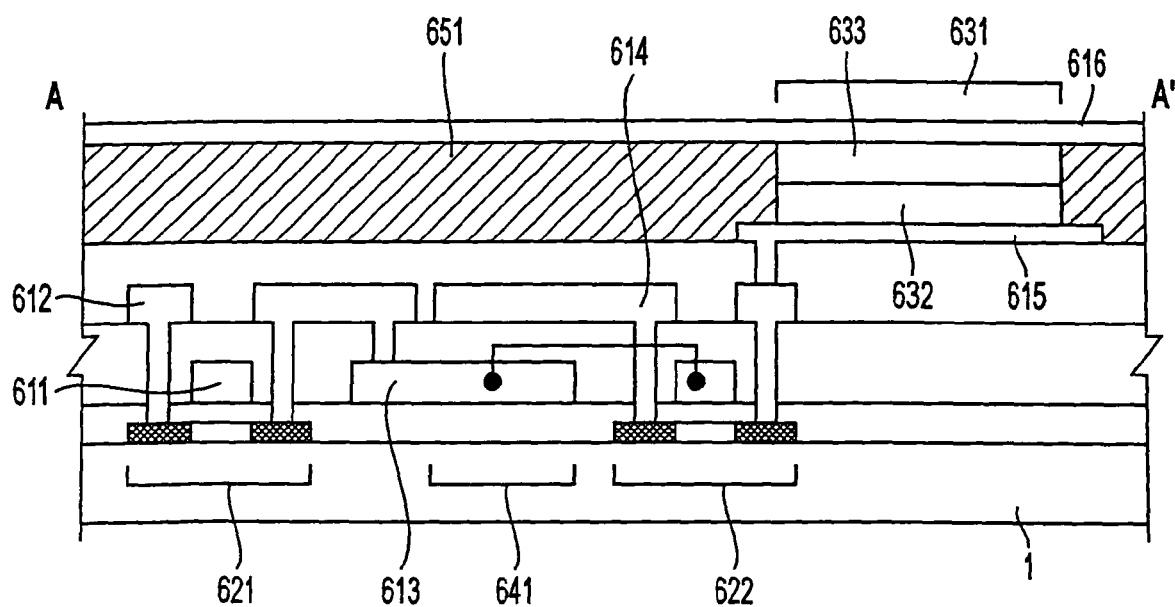
FIG. 11(a) is a sectional view of an organic EL display device equipped with thin-film transistors according to the second embodiment of the present invention, and FIG. 11(b)
Figure 11B:
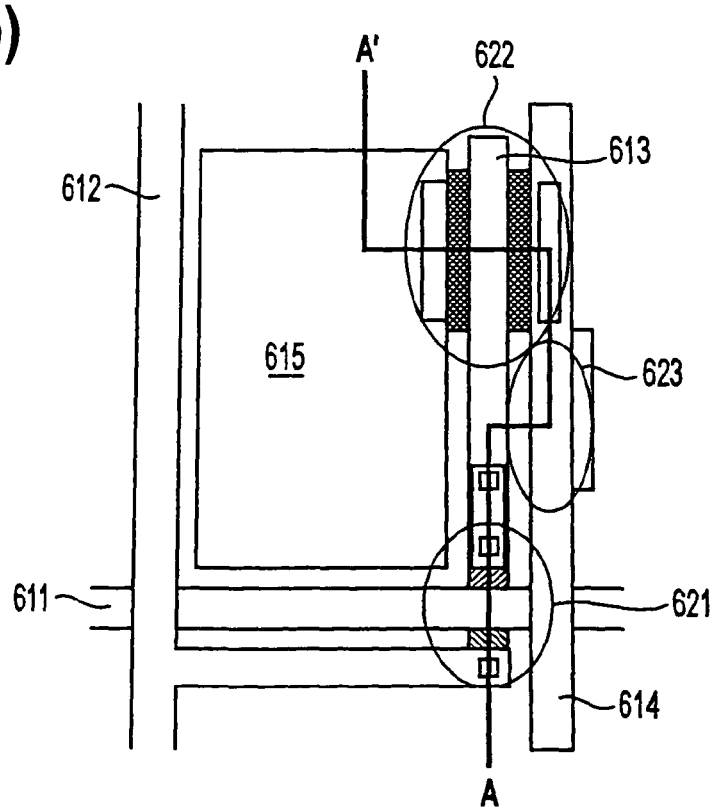

FIG. 11(a) is a sectional view of an organic EL display device (1 pixel) equipped with the thin-film transistors, according to the second embodiment of the present invention. FIG. 11(b) is a plan view of a thin-film transistor organic EL display device (1 pixel), according to the second embodiment of the present invention. The section taken along the line A-A' of FIG. 11(a) corresponds to the section taken along the line A-A' of FIG. 11(b).

FIG. 11(a) is the same as FIG. 6(a), except that it shows a hole injection layer 632 and an organic EL layer 633.

The reverse oriented organic EL display device 631 is formed by means of the pixel electrode 615 formed of ITO, the opposite electrode 616 formed of Al, the hole injection layer 632, and the organic EL layer 633. In the reverse oriented organic EL display device 631, the direction of current of the organic EL display device, indicated at 641, can be set to the direction from the pixel electrode 615 formed of ITO to the opposite electrode 616 formed of Al.

In this embodiment, a common potential 714 is higher than a counter potential 716. Further, the current-thin-film transistor is the p-channel type current-thin-film transistor 622.

In this embodiment, a signal potential 712 for the pixel to be in the display-state is higher than the counter potential 716.

Furthermore, in this embodiment, the signal potential 712 for the pixel to be in the non-display-state is lower than the common potential 714.

All of the effects of the thin-film transistor organic EL display device of this embodiment are also the same as those of the first embodiment, except that the potential relationship regarding the current-thin-film transistor is reversed due to the fact that the current-thin-film transistor is the p-channel type thin-film transistor 622.

In this embodiment, the current-thin-film transistor 122 is a p-channel type thin-film transistor. This arrangement enables the deterioration with time of the current-thin-film transistor 122 to significantly decrease. Furthermore, the arrangement adopting a p-channel type polysilicon thin-film transistor enables the deterioration with time of the current-thin-film transistor 122 to decrease even further.

FIG. 14 is a diagram of a process of producing the current-driven light-emitting display apparatus equipped with the thin-film transistors, according to the embodiment of the present invention described above.

Figure 14A:
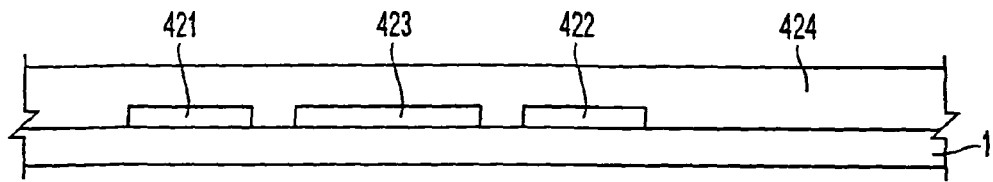
Figure 14B:
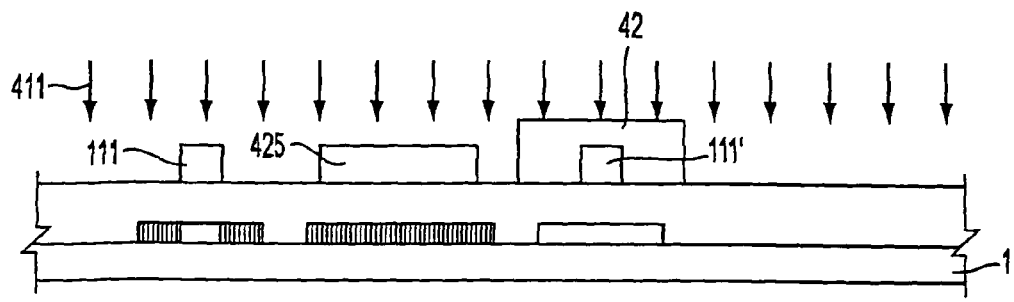
Figure 14C:
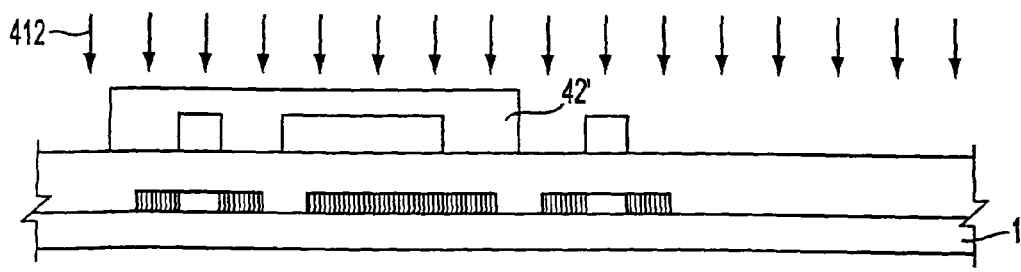

As shown in FIG. 14(a), an amorphous silicon layer with a thickness of 200 to 600 angstroms is deposited all over a substrate 1, and the amorphous silicon layer is polycrystallized by laser annealing etc., to form a polycrystalline silicon layer. After this, patterning is performed on the polycrystalline silicon layer to form a silicon thin-film 421, which serves as a source/drain channel region of the switching thin-film transistor 121, a first electrode 423 of the storage capacitor 123, and a silicon thin-film 422, which serves as a source/drain channel region of the current-thin-film transistor 122. Next, an insulation film 424, which serves as a gate insulation film, is formed over the silicon thin-films 421, 422, and the first electrode 423. Then, implantation of phosphorous (P) ions is selectively effected on the first electrode 423 to lower the resistance thereof. Next, as shown in FIG. 14(b), gate electrodes 111 and 111', which consist of TaN layers, are formed on the silicon thin-films 421 and 422 through the intermediation of the gate insulation film. Next, a resist mask 42 is formed on the silicon layer 422 serving as a current-thin-film transistor, and phosphorous (P) ions are implanted through self-alignment using the gate electrode as a mask to form an n-type source/drain region in the silicon layer 421. Subsequently, as shown in FIG. 14(c), a resist mask 412' is formed on the first silicon layer 421 and the first electrode, and boron (B) is ion-implanted in the silicon layer 422 through self-alignment using the gate electrode 111' as a mask to form a p-type source/drain region in the silicon layer 422. In this way, an n-channel type impurity doping 411 allows the switching thin-film transistor 121 to be formed. At this time, the current-thin-film transistor 122 is protected by the resist mask 42, so that the n-channel type impurity doping 411 is not performed. Then, a p-channel type impurity doping 412 allows the current-thin-film transistor 122 to be formed.

Further, though not illustrated, in a case in which a shift register of a drive circuit section which drives the switching transistor 121, and a thin-film transistor constituting a sample hold circuit etc., are to be formed on the same substrate, it is possible to form them simultaneously in the same step of process as has been described above.

A second electrode 425 of the storage capacitor may be formed together with the gate electrodes 111 and 111' simultaneously, either of the same or different materials.

Figure 14D:
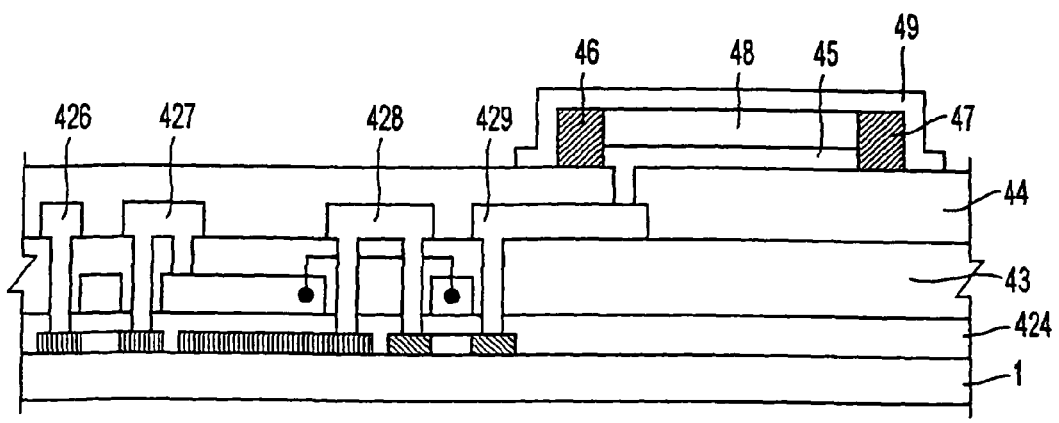

As shown in FIG. 14(d), after the formation of an inter-layer insulation film 43 and, then, contact holes, electrode layers 426, 427, 428 and 429 formed of aluminum, ITO or the like are formed.

Next, after an inter-layer insulation film 44 is formed and flattened, contact holes are formed; then, ITO 45 is formed with a thickness of 1000 to 2000 angstroms, preferably about 1600 angstroms, in such a manner that one electrode of the current-thin-film transistor is connected thereto. For each pixel region, bank layers 46 and 47, which are not less than 2.0 µm in width, are defined. Next, an organic EL layer 48 is formed by an ink-jet method etc., in the region surrounded by the bank layers 46 and 47. After the organic EL layer 48 is formed, an aluminum-lithium layer with a thickness of 6000 to 8000 angstroms is deposited as an opposite electrode 49 on the organic EL layer 48. Between the organic EL layer 48 and the opposite electrode 49, a hole injection layer may be disposed, as shown in FIG. 6(a).

The process mentioned above enables an organic EL display device driven by means of a high-performance thin-film transistor to be formed. Since polysilicon is much higher in the mobility of carriers than amorphous-silicon, a rapid operation is possible.

In particular, in this embodiment, when the p-type current-thin-film transistor 122 and the n-type switching thin-film transistor 121 are formed, it is possible to form both of n-type and p-type thin-film transistors, which are complementary type thin-film transistors constituting a shift register of a drive circuit, a sample hold circuit and the like, being simultaneously formed in the above mentioned embodiment. The arrangement makes it possible to realize a construction capable of decreasing the deterioration with time of the current-thin-film transistor 122, without increasing the number of production steps.

As described above, in the first embodiment, an n-channel type current-thin-film transistor is used, and, in the second embodiment, a p-channel type current-thin-film transistor is used. Here, the deterioration with time of p-channel and n-channel type thin-film transistors will be examined.

FIG. 12 and FIG. 13 are charts showing respectively the deterioration with time of n-channel type and p-channel type thin-film transistors, especially of polysilicon thin-film transistors, under equivalent voltage application conditions. Numerals 511 and 512 of FIG. 12 indicate the conductivity characteristics of an n-channel type thin-film transistor, in the cases in which Vd=4V and in which Vd=8V, respectively, before voltage application. Numerals 521 and 522 indicate the conductivity characteristics of an n-channel type thin-film transistor, in the cases in which Vg=0V and Vd=15V and in which Vd=4V and Vd=8V, respectively, after voltage application of approximately 1000 seconds. Numerals 811 and 812 of FIG. 13 indicate the conductivity characteristics of a p-channel type thin-film transistor in the cases in which Vd=4V, and in which Vd=8V, respectively, before voltage application. Numerals 821 and 822 indicate the conductivity characteristics of a p-channel type thin-film transistor in the cases in which Vg=0V and Vd=15V, and in which Vd=4V and Vd=8V, respectively, after voltage application for approximately 1000 seconds. It can be seen that in the p-channel type thin-film transistor, the decrease of ON-current and the increase of OFF-current are smaller than in the n-channel type.

Taking into consideration the difference in the deterioration-with-time characteristic between the p-type and the n-type thin-film transistors as shown in FIG. 12 and FIG. 13 respectively, at least either a switching thin-film transistor or a current-thin-film transistor is formed of a p-channel type thin-film transistor, especially a p-type polysilicon thin-film transistor, whereby the deterioration with time can be suppressed. Further, by forming the switching thin-film transistor as well as the current-thin-film transistor of a p-type thin-film transistor, it is possible to maintain the characteristics of the display device.

While an organic EL display device is used as the luminescent device in the embodiment described above, this should not be construed restrictively, yet, it is needless to say that an inorganic EL display device or other current-driven luminescent devices are also applicable.

INDUSTRIAL APPLICABILITY

The display apparatus according to the present invention can be used as a display apparatus equipped with a current-driven luminescent device such as an organic EL display device or an inorganic EL display device, and a switching device to drive the luminescent device, such as a thin-film transistor.

What is claimed is:
1. An electroluminescent device comprising:
   a substrate;
   a transistor disposed above the substrate, the transistor including a gate electrode, a silicon film opposing the gate electrode, and a gate insulating film between the gate electrode and the silicon film;
   a first interlayer insulation film covering the transistor;
   a second interlayer insulation film disposed above the first interlayer insulation film;
   a pixel electrode disposed above the second interlayer insulation film and electrically connected to the transistor;
   an organic EL layer disposed between the pixel electrode and a counter electrode;
   a capacitor including a first electrode formed by the same material as the silicon film and a second electrode formed by the same material as the gate electrode; and
   a bank layer, the organic EL layer being formed in a region surrounded by the bank layer, wherein the capacitor is disposed at least in an area where the bank layer is not disposed when viewed in a direction perpendicular to a major surface of the substrate.

2. The electroluminescent device according to claim 1, the second interlayer insulation film being flattened.

3. The electroluminescent device according to claim 1, wherein the bank layer does not overlap the capacitor layer when viewed in the direction perpendicular to the major surface of the substrate.

4. An electroluminescent device comprising:
a substrate;
a transistor disposed above the substrate, the transistor including a gate electrode, a silicon film opposing the gate electrode, and a gate insulating film between the gate electrode and the silicon film;
a first interlayer insulation film covering the transistor;
a second interlayer insulation film disposed above the first interlayer insulation film;
a pixel electrode disposed above the second interlayer insulation film and electrically connected to the transistor;
an organic EL layer disposed between the pixel electrode and a counter electrode;
a capacitor including a first electrode formed in the same layer with the silicon film and a second electrode formed in the same layer with the gate electrode; and
a bank layer, the organic EL layer being formed in a region surrounded by the bank layer, wherein the capacitor is disposed at least in an area where the bank layer is not disposed when viewed in a direction perpendicular to a major surface of the substrate.

5. The electroluminescent device according to claim 4, wherein the bank layer does not overlap the capacitor layer when viewed in the direction perpendicular to the major surface of the substrate.

* * * * *